United States Patent [19]

Petro

[11] Patent Number: 4,737,717

[45] Date of Patent: Apr. 12, 1988

[54] MAGNETIC FIELD CORRECTION USING A CHANNEL FOR POSITIONING MAGNETIC MATERIAL

[75] Inventor: Alan Petro, Finesville, N.J.

[73] Assignee: Siemens Medical Systems Inc., Iselin, N.J.

[21] Appl. No.: 31,337

[22] Filed: Mar. 26, 1987

[51] Int. Cl.⁴ .............................................. G01R 33/20
[52] U.S. Cl. ...................................... 324/320; 324/318
[58] Field of Search ............... 324/318, 319, 320, 300; 335/216, 299

[56] References Cited

U.S. PATENT DOCUMENTS

| | | | |
|---|---|---|---|
| 3,423,670 | 1/1969 | Parker et al. | 324/320 |
| 3,564,398 | 2/1971 | Nelson | 324/320 |
| 3,750,067 | 7/1973 | Fletcher et al. | 335/296 |
| 4,425,547 | 1/1984 | Sugimoto | 324/318 |
| 4,590,452 | 5/1986 | Ries et al. | 335/301 |
| 4,631,481 | 12/1986 | Young et al. | 324/320 |

FOREIGN PATENT DOCUMENTS 0111219 6/1984 European Pat. Off. .
0151036 8/1985 European Pat. Off. .
0171831 2/1986 European Pat. Off. .

OTHER PUBLICATIONS

Article by Von H. Morneburg entitled "Gesichtspunkte Bei Der Standortsuche Und Planung Fur Ein Magnetom" in 2332 Electro Medica (Siemens), vol. 51 (1983), No. 2, Erlangen, Deutschland, pp. 65-72.

*Primary Examiner*—Stewart J. Levy
*Assistant Examiner*—Kevin D. O'Shea
*Attorney, Agent, or Firm*—Lawrence C. Edelman

[57] ABSTRACT

Apparatus for substantially reducing field-strength non-uniformities in the bore of a magnet, comprising, a main field producing means for developing a main magnetic field in the bore which is subject to at least one field-strength non-uniformity, a liner of substantially non-magnetic material adapted to be positioned within the bore and having associated therewith at least one channel dimensioned for transporting magnetic material therethrough, and means for introducing and positioning magnetic material within the channel so as to substantially reduce the field strength of the non-uniformity within the bore.

11 Claims, 2 Drawing Sheets

MAGNETIC FIELD CORRECTION USING A CHANNEL FOR POSITIONING MAGNETIC MATERIAL

BACKGROUND OF THE INVENTION

1. Field of the Invention

The present invention relates to a method and apparatus for substantially reducing field strength non-uniformities in the bore of the high field magnet and is particularly useful for homogenizing the primary magnetic field of a magnetic resonance investigatory device, such as a magnetic resonance imager or spectrometer.

2. Description of the Prior Art

Investigative apparatus, such as a magnetic resonance imager (MRI) device or spectrometer, determine characteristics of a test object by subjecting the object to a high (primary) magnetic field and RF-pulses and then examining the resolvable MR spectra. Examination is carried out by detecting precessions of the various classes of protons of the test object caused by the magnetic fields and RF-pulses. In order for the detected precessions to accurately reflect resolvable characteristics of the full volume of the test object, all portions of the test object must be subjected to a primary magnetic field of uniform field strength. This is particularly true for physically large MRI devices, such as those designed for imaging various portions of a human being, and even for small magnetic resonance devices which have a high field strength designed for determining the chemical makeup of the test object, i.e., a field strength in the order of 1-10 tesla, since even slight magnetic field non-uniformities at these field strengths leads to inaccurate results after processing the detected resonance signals.

U.S. Pat. No. 3,564,398 issued Feb. 16, 1971 to Nelson discloses one type of prior art technique for homogenizing a magnetic field, comprising a plurality of correction coils which are independently positioned within the primary field and energized so as to cancel certain field strength non-uniformities of the field. This technique suffers from the disadvantage that the correction coils necessarily increase the mechanical and electrical complexity of the magnetic resonance device and furthermore require a separately controllable and highly regulated correction coil power supply. Additionally, the reliability of the magnetic resonance device is reduced and its accuracy is in jeopardy if the correction coil power supply should have a fluctuation or failure.

U.S. patent application Ser. No. 742,811 of Frese and assigned to the same assignee as the present invention, uses strategically placed ferromagnetic sheets (i.e., iron plates) in close proximity to the magnet winding in order to reduce magnetic field non-uniformity. This technique, although being less complex and therefore inherently more reliable than the above-noted correction coil technique, is inconvenient in situations where it may be necessary to change the position and/or number of the iron plates in order to correct for a changed magnetic field strength of the device or a physical repositioning of the device after its initial installation. Furthermore, in small bore magnets, it may be impossible to gain access to the iron plates located on the inside of the bore, and in large bore magnets, the device must be shut down in order to allow entry of workmen to reposition and secure the iron plates in new locations. The downtime associated with the repositioning of the plates takes the device out of service for a substantial period of time and is therefore relatively inconvenient and costly to the owner.

It is an object of the present invention to provide a method and apparatus for substantially reducing magnetic field strength non-uniformities which is mechanically simple, does not consume power, has long-term reliability and which is relatively easy to adjust in the event of changes in the magnetic field non-uniformities to be corrected.

SUMMARY OF THE INVENTION

In accordance with the principles of the invention a certain non-uniformity within the magnetic field in the bore of a magnet is substantially reduced by selectively positioning magnetic material within the bore via at least one channel associated with a non-magnetic liner positioned within the bore.

The above-noted features and advantages of the invention will be apparent from the following description of the preferred embodiments and from the claims.

For a fuller understanding of the invention, reference should now be made to the following description of the preferred embodiments of the invention and to the accompanying drawings.

DETAILED DESCRIPTION OF THE PREFERRED EMBODIMENTS

Figure 1A:
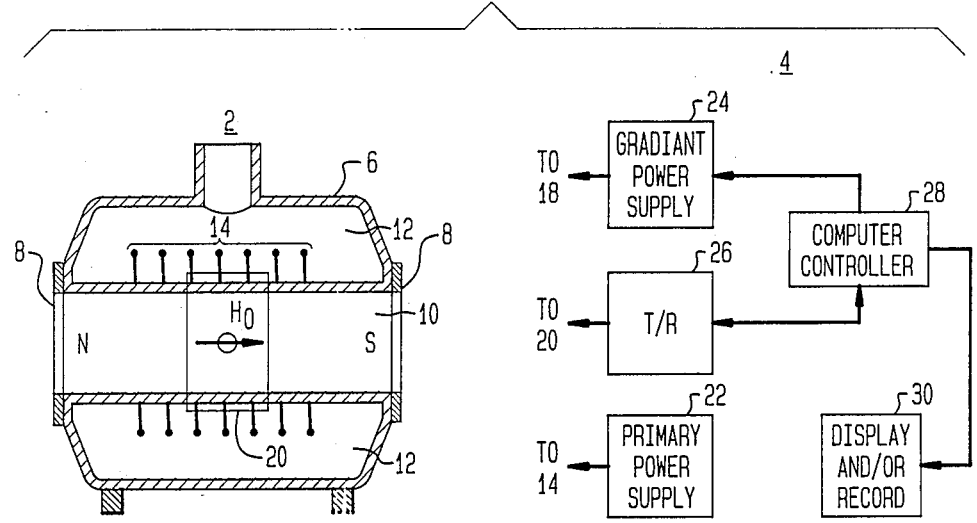
FIGS. 1a, 1b, 1c and 1d illustrate a magnetic resonance imaging system, partially in block diagram form and partially in cross-section and perspective view form, including apparatus constructed according to the principles of the present invention for homogenizing the primary magnetic field.
Figure 1B:
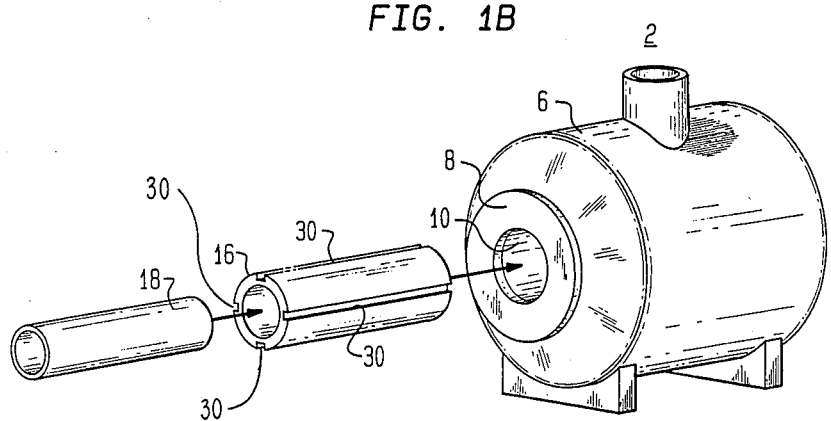

FIG. 1a illustrates a cross-section view of a superconducting magnet assembly 2 and a block diagram of an associated electronic system 4 for operating magnet 2 and developing an image of a test object (not shown) placed therein. FIG. 1b illustrates a prespective view of magnet 2. Superconducting magnet 2 includes a cylindrical housing 6 and end plates 8 having holes in the center thereof for allowing the test object to be placed in a cylindrical bore 10 of magnet 2. A cylindrical chamber 12 within housing 6 includes a primary magnetic field winding 14 for developing a primary magnetic field $H_o$ axially aligned within bore 10.

For providing a high magnetic field, i.e., in the order of 1-10 tesla, winding 14 is supercooled by submersion in liquid helium contained within the walls of chamber 12. Although not shown, chamber 12 typically includes a chamber of liquid nitrogen which surrounds a chamber of liquid helium. A chamber having a high vacuum is also used for insulating the liquified gases and reducing their evaporation rate.

A non-magnetic channel liner 16 is placed within bore 10, the purpose of which is to correct for magnetic field strength non-uniformities in accordance with the principles of the invention, as will be explained in detail later on. Within liner 16 is placed a cylindrical arrangement of gradient coils 18, which provide X, Y and Z axis magnetic field gradients within bore 10, as well known, for affecting a sequential "image sliding" of the test object.

An RF-coil 20 is also included within housing 6 for selectively exciting certain protons within the test object and thereafter receiving signals from the excited protons as they return to an equalibrium position established by the primary and gradient magnetic fields.

Electronic system 4 includes a primary power supply 22 for supplying current (at least initially) to primary winding 14, a gradient power supply for supplying currents to gradient winding assembly 18 and a transmit and receive (T/R) module 26 which transmits RF (radio frequency) energy to RF-coil 20 and receives magnetic resonance signals picked up by coil 20 from the precessing protons of the test object.

Computer controller 28 controls the applicatin of currents to gradient assembly 18 and via its connection to T/R module 26, controls the transmission and reception processing of signals to and from RF-coil 20. T/R module 26 processes the received signals for developing an image signal of the test object which then is used to display or record an image via display/record unit 30. Except for certain details of channel liner 16, to be described in detail later on, the above described apparatus is constructed and operates as a conventional magnetic resonance imager of the medical diagnostic type, well known to those skilled in the art and commercially available from a variety of manufacturers.

As part of the normal start-up procedure for an MRI device, either after its initial assembly or after a relocation to a new physical position, the main winding is energized and allowed to stabilize for a period of time. Thereafter, an apparats such as a magnetometer is passed through the bore of the magnet along its central axis and the field strength of the primary magnetic field is electronically sensed and recorded. These magnetic field strength measurements reveal the uncorrected or "virgin" primary magnetic field in three-dimensional coordinate terms (X, Y and Z) and allows an overall description of the field t be electronically stored and available for further processing.

Computer processing systems, of the type in general use today, process the uncorrected primary magnetic field data so as to provide correction data which indicates the position and magnetic field strength of magnetic correction fields which are required to homogenize the primary magnetic field. Computer processing of this type is used, for example, to energize the magnetic correction coils illustrated in the previously noted U.S. Pat. No. 3,564,398, and such computer programs are widely available from magnet manufacturers. It is then a relatively simple matter to convert this position and field strength data of the magnetic correction fields to equivalent data representative of the position and amount of ferromagnetic material required to be positioned within the primary magnetic field in order to achieve the same effect.

Figure 1C:
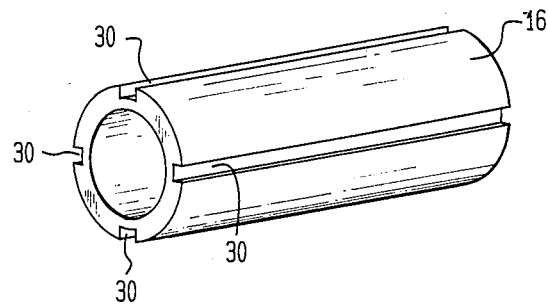
Figure 1D:
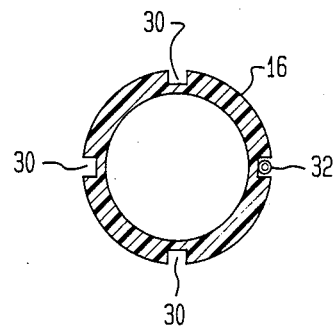

In accordance with the principles of the invention, ferromagnetic material is positioned within bore 10 of magnet 2, in accordance with the data generated by the above-noted computer processing, using transportation channels associated with non-magnetic liner 16. As shown in the perspective and cross section views of liner 16 illustrated in FIGS. 1c and 1d, respectively, liner 16 includes a plurality of rectangular channels 30 formed along the outside surface of its length. Each channel 30 includes a tube 32 (only one illustrated for the sake of clarity) which is dimensioned so as to not interfere with the positioning of liner 16 within bore 10. Tubes 32 are used for transporting and positioning ferromagnetic material within bore 10 in close proximity to the primary field windings 14, in order to substantially reduce the field-strength non-uniformities in the primary magnetic field.

Figure 2:
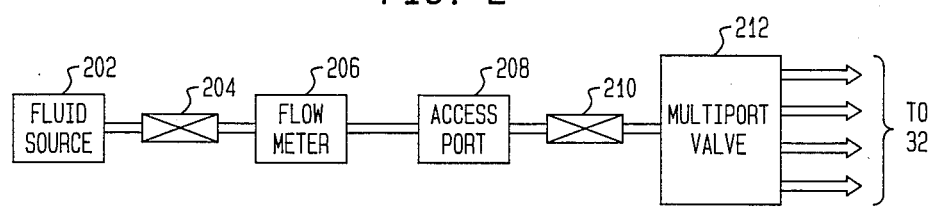
FIG. 2 illustrates apparatus useful for positioning magnetic material within channels illustrated in the liner shown in FIGS. 1b, 1c and 1d.

One end of each of tubes 32 are adapted to be coupled to the apparatus of FIG. 2, which introduces and positions the ferromagnetic material into respective ones of tubes 32, and the other end of each tube 32 includes an of/off valve (not shown) for sealing each tube after the ferromagnetic material has been properly positioned therein. The FIG. 2 apparatus includes a source 202 of pressurived fluid which is supplied to a series connection of a control valve 204, a flow meter 206, an access port 208, a control valve 210 and a multiport valve 212. Each output of multiport valve 212 is connected to a respective one of tubes 32 for supplying the ferromagnetic material thereto.

The FIG. 2 apparatus can be used in a variety of ways for introducing and positioning ferromagnetic material into tubes 32. For example, the pressurized fluid may itself be a ferromagnetic material which is positioned into selected ones of tubes 32 by appropriate positioning of multiport valve 212. The ferromagnetic fluid may comprise, for example, an iron oxide in an oil based carrier. Such ferromagnetic fluids are available from Ferrofluidics Corporation, 40 Simon Street, Nashua, NH 03061. Access port 208 can introduce measured amounts of non-magnetic filler fluid into the stream of magnetic field in order to change the concentration of the ferromagnetic fluid within individual ones of tubes 32 by a desired amount in accordance with the results of the computer analysis of the virgin primary magnetic field. Alternatively, access port 208 could be used for positioning a non-magnetic material (i.e., slugs) into the ferromagnetic fluid. This is accomplished by closing valves 204 and 210, inserting the desired number of slugs into the fluid path via access port 208 and then first opening valve 210 and controlling the opening of valve 204 while watching flow meter 206. Flow meter 206 is calibrated to indicate the position of the slugs as they are transported by the fluid into respective ones of tubes 32. Data concerning the amount of slugs required and their positioning within each of tubes 32 in order to homogenize the primary magnetic field is provided by the computer analysis of the virgin field. Additional slugs can be easily added as required by operation of valves 204 and 210 and access port 208.

Once a selected one of tubes 32 has been properly filled with ferromagnetic material, its other end is closed using its respective on/off valve and the procedure is repeated with the next tube 32, if indicated by the computer analysis.

The above described technique is a relative simple operation which is both quick to perform and highly stable over time. If the position of the MR device is moved or its magnetic field strength is changed, it is a relatively simple matter to re-homogenize the magnetic field.

Thus, there has been shown and described novel apparatus for homogenizing the primary magnetic field of an MR device. Many changes, modifications, variations and other uses and applications of the subject invention will, however, become apparent to those skilled in the art after considering this specification and its accompanying drawings which disclose preferred embodiments thereof. For example, instead of having a ferromagnetic fluid with non-magnetic slugs inserted therein, the fluid itself may be non-magnetic and instead ferromagnetic slugs could be used. Additionally, it should be noted that although FIG. 1c indicates that channels 30 and tubes 32 are relatively straight throughout the length of liner 16, in fact, the path of channels 30 and tubes 32 can be quite convoluted so as to take into account anticipated non-uniformities.

All such changes, modifications, variations and other uses and applications which do not depart from the spirit and scope of the invention are deemed to be covered by the invention which is limited only by the claims which follow.

What I claim is:

1. Apparatus for substantially reducing field-strength non-uniformities in the bore of a magnet, comprising:
   main field producing means for developing a magnetic field in said bore, said field being subject to at least one field-strength non-uniformity;
   a linear of substantially non-magnetic material adapted to be positioned within said bore and having associated therewith at least one channel dimensioned for transporting magnetic material therethrough; and
   means for introducing and positioning a fluid medium including magnetic material within said channel so as to substantially reduce the field strength of said at least one non-uniformity within said bore.

2. Apparatus according to claim 1, wherein said introducing and positioning means includes:
   means for pumping said fluid medium into said channel.

3. Apparatus according to claim 2, wherein:
   said fluid medium is ferromagnetic and said introducing means includes means for introducing a substantially non-magnetic material into said magnetic fluid.

4. Apparatus according to claim 2, wherein:
   said fluid medium is substantially non-magnetic and said introducing means also includes means for introducing a magnetic material into said non-magnetic fluid.

5. Apparatus according to claim 2, wherein:
   said fluid medium is magnetic and said means for introducing and positioning includes means for controlling the concentration of said fluid material.

6. Apparatus according to claim 1, wherein:
   said main field producing means includes means for changing the strength of said field, thereby generating a non-uniformity having a changed field-strength and/or position; and
   said means for introducing and positioning a fluid medium is controllable so as to change the amount and/or position of said magnetic material within said channel so as to substantially reduce the field strength of said changed non-uniformity.

7. Apparatus according to claim 6, wherein:
   said main field producing means comprises a superconducting magnet.

8. A method for substantially reducing at least one field strength non-uniformity in the bore of a magnet, comprising:
   providing at least one non-magnetic channel within said bore;
   introducing a fluid including magnetic material into said channel; and
   positioning said magnetic material within said channel so as to substantially cancel said field strength non-uniformity within said bore.

9. The method of claim 8, wherein:
   said introducing step comprises introducing into said channel a ferromagnetic fluid having substantially non-magnetic slugs inserted therein.

10. The method of claim 8, wherein:
    said introducing step comprises introducing into said channel a substantially non-ferromagnetic fluid having ferromagnetic slugs inserted therein.

11. The method of claim 8, wherein:
    said introducing step comprises introducing into said channel a controllable concentration of ferromagnetic fluid material.

* * * * *